| DIMENSION | VALUE (INCHES) |
|---|---|
| a | 0.034 |
| b | 0.020 |
| c | 0.030 |
| d | 0.005 |
| e | 0.003 |
| f | 0.020 |
| W | 0.007 |

INVENTORS
MARTIN CAULTON
STANLEY P. KNIGHT
RALPH DISTEFANO
BY [signature]
ATTORNEY INVENTORS
MARTIN CAULTON
STANLEY P. KNIGHT
RALPH DiSTEFANO
BY [signature]
ATTORNEY INVENTORS
MARTIN CAULTON
STANLEY P. KNIGHT
RALPH DiSTEFANO
BY [signature]
ATTORNEY

INVENTORS
MARTIN CAULTON
STANLEY P. KNIGHT
RALPH DISTEFANO

BY [signature]
ATTORNEY

United States Patent Office 3,554,821
Patented Jan. 12, 1971

3,554,821

PROCESS FOR MANUFACTURING MICROMINIATURE ELECTRICAL COMPONENT MOUNTING ASSEMBLIES

Martin Caulton, Princeton, Stanley P. Knight, Hightstown, and Ralph Di Stefano, Mercerville, N.J., assignors to RCA Corporation, a corporation of Delaware
Filed July 17, 1967, Ser. No. 653,849
Int. Cl. C03c *15/00;* C23f *1/02*
U.S. Cl. 156—3 9 Claims

ABSTRACT OF THE DISCLOSURE

A process for manufacturing a microminiature mounting assembly for receiving a semiconductor wafer. The assembly is of laminated construction having a metal supporting layer, a U-shaped glass insulating layer, and metal terminal layers on each leg of the U. The semiconductor wafer is secured to the metal supporting layer within the area enclosed by the U and electrodes on the upper surface of the wafer are connected to their corresponding metal terminal layers.

The mounting assembly is manufactured by techniques analogous to those employed for making monolithic integrated circuits, involving (i) formation of a metal-insulator-metal sandwich employing a selectively etchable photosensitive glass as the insulating material, the glass being exposed in accordance with the desired U-shaped pattern before the adjacent metal layers are deposited, (ii) etching of the insulating layer to form the desired U-shaped patterns, and (iii) separation of the mounting assemblies from each other. Selective deposition and photoetching techniques resembling those utilized in integrated circuit manufacture are employed throughout the process.

BACKGROUND OF THE INVENTION

This invention relates to the field of microminiature electrical component mounting assemblies and more particularly to a process for economically manufacturing large numbers of such assemblies by batch processing techniques.

A common type of electrical circuit construction is that known as the "hybrid" arrangement, in which discrete active electrical components in microminiature packages are directly bonded to terminal areas on a printed circuit or thin film substrate.

Much work has been done in developing techniques for providing suitable packages for these active components. Such packages should be mechanically rugged, have a size not much larger than that of the active element itself, provide good thermal heat transfer between the active element and the substrate to which the component is to be secured, and introduce negligible parasitic impedance. The microminiature packages heretofore known have not attained these objectives, and have generally involved rather complex and expensive manufacturing methods including manual operations not readily adaptable to mass production techniques.

Accordingly, an object of the present invention is to provide a process for manufacturing, in an economical manner, large quantities of microminiature electrical component mounting assemblies having the aforementioned desirable qualities.

SUMMARY

The invention provides a process for manufacturing a large number of electrical component mounting assemblies involving the steps of (i) conditioning a selectively etchable material in accordance with a predetermined pattern to render portions of the material soluble in a given etchant, (ii) forming a metal-insulator laminate in which the insulator is the selectively etchable material, (iii) depositing metallic terminal layers on selected portions of the insulator, nad (iv) selectively etching the insulating material to produce a metal-insulator-metal mounting assembly, the etching being carried out in such a manner that each such mounting assembly has a metallic portion free of insulating material to which the electrical componnet to be mounted may be secured.

Figure 4A:
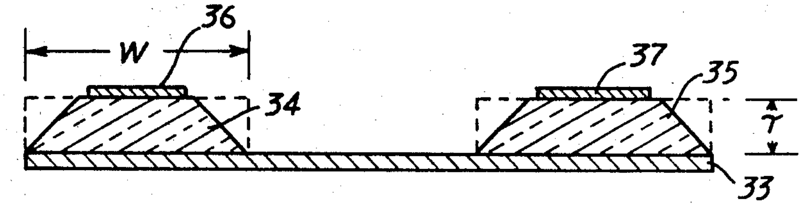
Figure 4B:
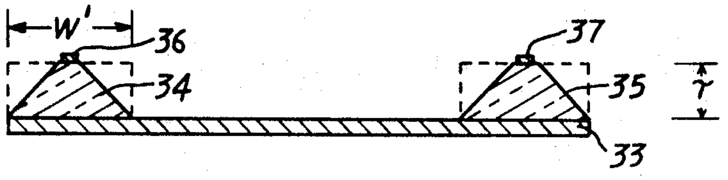
Figure 4C:
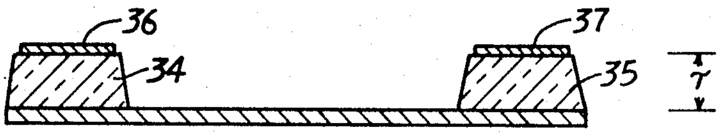
Figure 5:
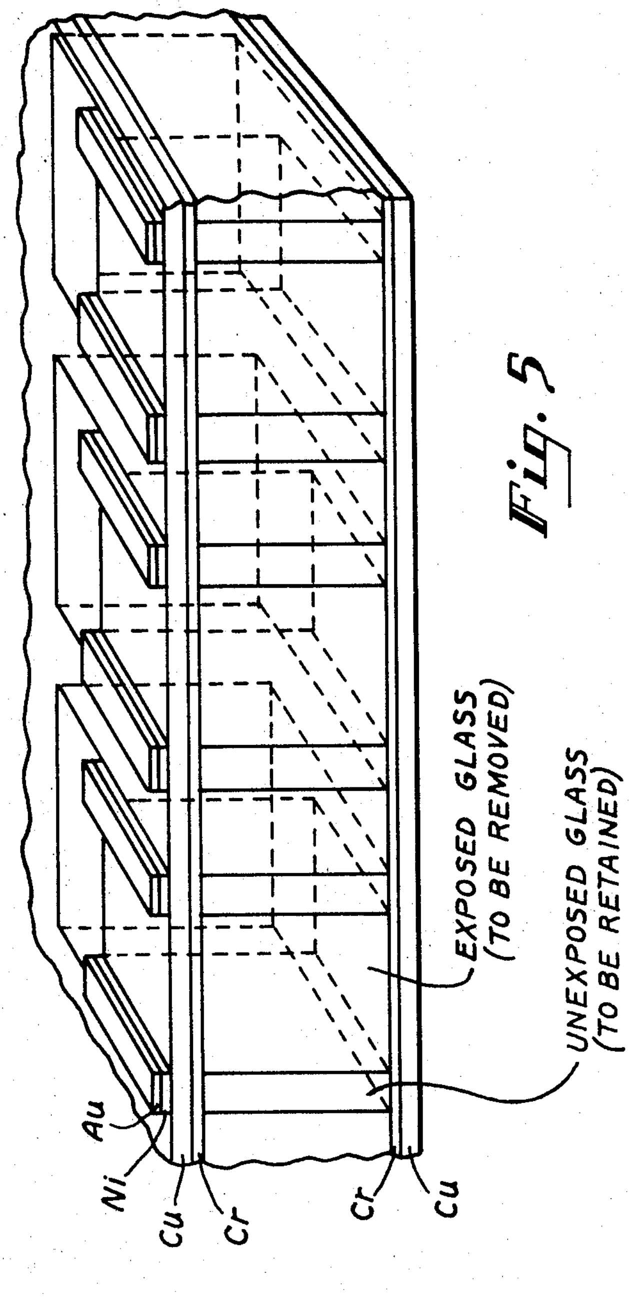
Figure 6:
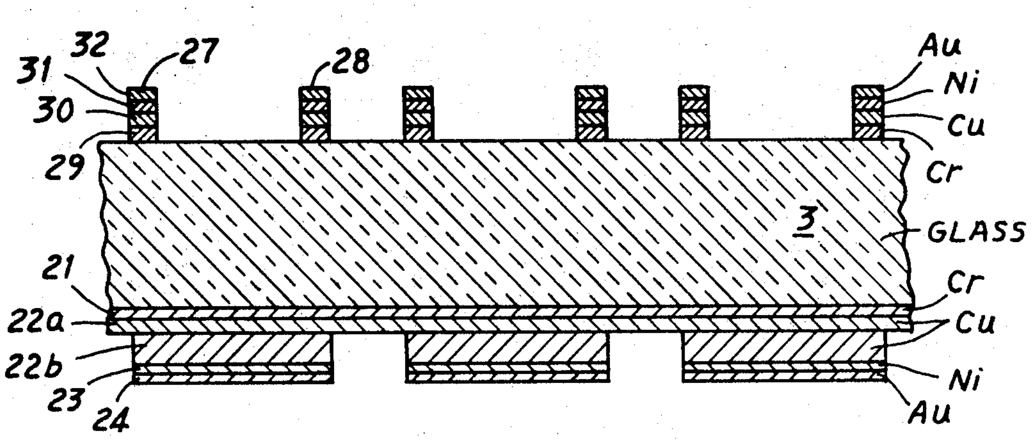
Figure 7:
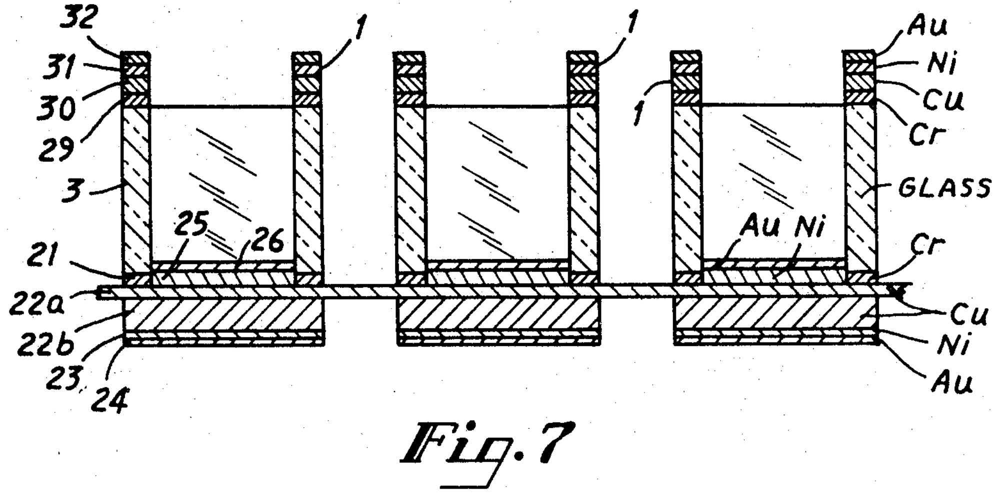

FIGS. 4A, 4B, and 4C show cross sectional views of various assemblies useful in explaining the process of the invention;

FIG. 5 shows an orthogonal view of three mounting assemblies at an intermediate stage of manufacture according to the invention;

FIG. 6 shows a cross sectional view of three mounting assemblies at a further intermediate stage of manufacture; and FIG. 7 shows a cross sectional view of three mounting assemblies just prior to the final major step of the process according to the invention.

DETAILED DESCRIPTION

Figure 1A:
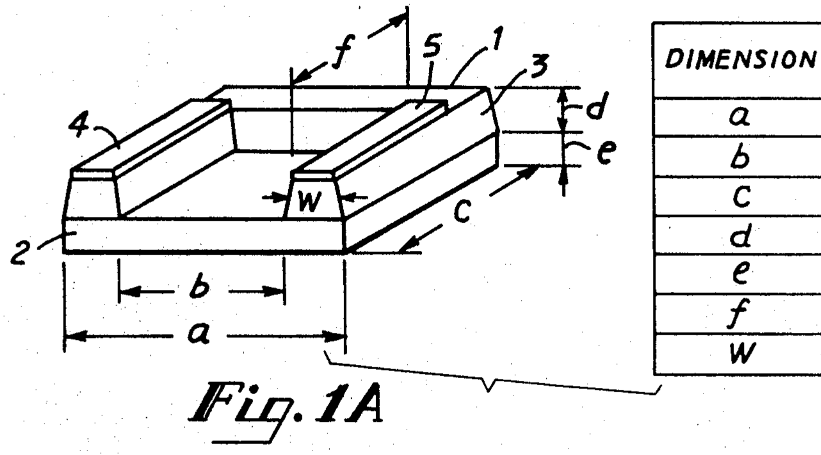
FIG. 1A shows a preferred configuration for an electrical component mounting assembly manufactured according to the process of the invention.

FIG. 1A shows, in outline form, an electrical component mounting assembly which has been manufactured according to the process of our invention. The particular assembly 1 shown in FIG. 1A has been manufactured to accept a transistor wafer which is on the order of 15 mils (1 mil=0.001 inch) square and 5 mils high. The assembly 1 includes a supporting metallic layer 2 upon which is situated an adherent U-shaped insulating layer 3 which is made of a selectively etchable photosensitive material. Disposed on the legs of the U are terminal layers 4 and 5. Typical preferred values for the dimensions of the assembly are shown in the table of FIG. 1A. It will be noted that the open area in the center of the U, which is adapted to receive the transistor wafer, has dimensions *b* and *f* of 20 mils square, only slightly larger than the size of the wafer itself. The thickness *d* of the insulating layer 3 is 5 mils, i.e. approximately equal to that of the transistor wafer to be mounted.

It is thus seen that the mounting assembly to FIG. 1A is extremely small and therefore provides very low parasitic impedance as well as good thermal conductivity between the transistor wafer and any substrate to which the supporting film 2 may be secured.

In use, the electrical component (a semiconductor device in our preferred embodiment) to be mounted is bonded to the supporting film 2 in the open area of the U, and electrodes on the upper surface of the component are connected to the corresponding terminal layers 4 and 5. It is clear that any number of terminal layer areas desired could be provided on the upper surface of the insulating layer 3 and that the insulating layer 3 could be other than U-shaped.

Figure 1B:
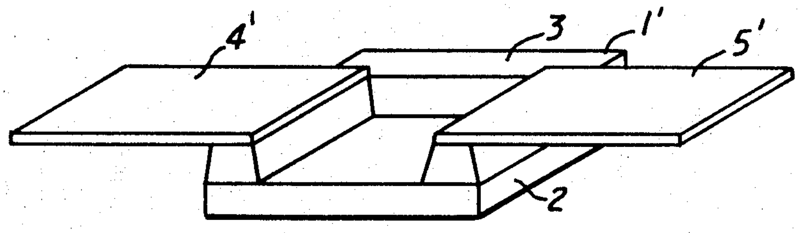
FIG. 1B shows an alternative form for such a mounting assembly.

FIG. 1B shows an alternative construction in which the terminal layer areas 4′ and 5′ are cantilevered in order to produce a "beam lead" structure in which the terminals 4′ and 5′ may be directly bonded to the same underlying printed circuit substrate to which the supporting film 2 is secured.

Figure 2:
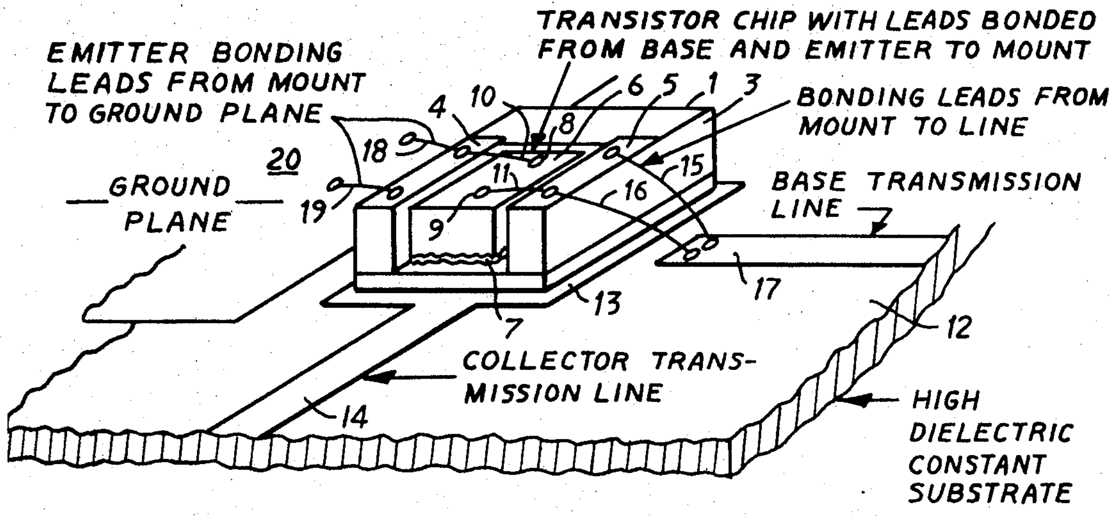
FIG. 2 shows, in stylized form, a mounting assembly made according to the invention containing an active semiconductor element, the mounting assembly being secured to a printed circuit substrate.

FIG. 2 is a stylized drawing illustrating the manner in which a transistor wafer is received in the mounting assembly 1 and the manner in which the completed mounting assembly is secured to a printed circuit substrate. In FIG. 2, the assembly 1 contains a microwave transistor 6 having a collector electrode 7 on the lower surface of the semiconductor wafer and emitter and base electrodes 8 and 9 respectively on the upper surface of the wafer. Short leads 10 and 11, of gold wire having a diameter on the order of 1 mil, are interconnected between the emitter and base electrodes 8 and 9 and the terminal layers 4 and 5 respectively. The interconnecting leads 10 and 11 may be secured to the electrodes and terminal areas by soldering or ultrasonic bonding methods. The collector electrode 7 on the lower surface of the transistor wafer 6 is soldered to the area of the supporting film 2 within the U-shaped opening which is free of the insulating material 3.

The completed mounting assembly is secured to a printed circuit board 12 containing a strip-type microwave transmission line pattern. The supporting film 2 of the mounting assembly 1 is directly soldered to a terminal pad 13 which is electrically connected to the collector transmission line 14. This connection serves to provide good thermal conductivity between the transistor 6 and the transmission line terminal pad 13 and circuit board 12.

Electrical leads 15 and 16 (connected in parallel to reduce the series inductance introduced by these leads) are secured at opposite ends to the base terminal layer 5 and the base transmission line 17 respectively. Similarly, electrical leads 18 and 19 connect the emitter terminal layer 4 to the transmission line ground plane 20, so that the installed transistor operates in the grounded emitter configuration.

It is seen that the mounting assembly 1 thus provides a package well suited for use with microminature high frequency, high power electrical components and which is particularly suitable for housing semiconductor devices; the package is mechanically strong and resistant to thermal shock so that the assembly 1 may be readily removed from the circuit board 12 without damaging the board or the mounted transistor 6.

Figure 3:
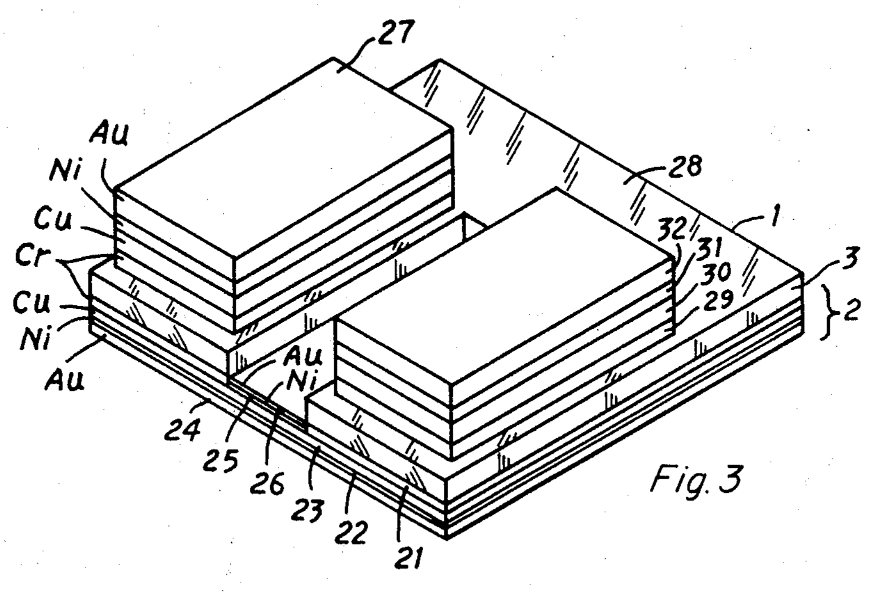
FIG. 3 shows the detailed construction of a mounting assembly made according to the invention, in which the scale is exaggerated to show specific structural features of the assembly.

FIG. 3 shows a more detailed view of the mounting assembly 1 of FIG. 1A, drawn to an exaggerated scale in order to better show the constituent parts of the assembly. The supporting film 2 is a laminate consisting of a thin layer 21 of chromium securely bonded to the lower surface of the insulating layer 3, which is a selectively etchable photosensitive glass in our preferred embodiment. The chromium layer 21 is closely adherent to the glass layer 3, and has a thickness on the order of 200 angstroms.

Situated adjacent the chromium layer 21 is a relatively thick copper layer 22, having a total thickness on the order of 3 mils. It is this copper layer 22 which provides the mechanical strength of the supporting film 2. Situated on the copper layer 22 is a contiguous nickel layer 23. A gold layer 24 is disposed on the nickel layer 23. The gold layer 24 is preferably extremely pure (on the order of 99.9+% gold) in order to provide good soft solderability characteristics. The nickel layer 23 acts as a barrier to prevent gold from diffusing through the copper layer 22 to the interface between the chromium layer 21 and the adjacent glass layer 3. It has been observed that if gold is permitted to diffuse toward this interface, there is a resultant reaction with a tendency to cause lifting of the chromium layer 21 from the adjacent glass layer 3.

Again referring to FIG. 3, the glass layer 3 is of U-shaped form and the opening in the U contains a nickel layer 25 disposed on the copper layer 22. A substantially (99.9+%) pure gold layer 26 covers the nickel layer 25.

On the upper surface of the glass layer 3 are situated metallic films 27 and 28 (corresponding to the terminal layers 4 and 5 of FIGS. 1 and 2) respectively, which serve as terminal areas for electrodes disposed on the upper surface of the electrical component to be mounted within the open area of the assembly 1. Each of the metallic film 27 and 28 includes (i) a thin (on the order of 200 angstroms) chromium layer 29, which adheres well to the underlying glass layer 3, (ii) a relatively thick copper layer 30, (iii) an overlying nickel layer 31, and (iv) a substantially pure gold layer 32 (in order to provide good ultrasonic bonding characteristics) disposed on the nickel layer 31. The copper layer 30 is not essential, but is inherently provided by the preferred embodiment of our process.

The insulating layer 3 employed in assemblies manufactured according to our process should be of a radiation-sensitive selectively etchable material. The reason for utilizing such a material is that the width of each of the legs of the U-shaped mounting assembly (shown as the dimension $w$ in FIG. 1A) is on the same order as the thickness of the insulating layer 3. Difficulties are encountered in employing conventional etching methods where such relative dimensions are involved. These difficulties are best understood by reference to FIG. 4 of the drawing.

In FIG. 4 there are shown various cross sectional views of a U-shaped structure including (i) a supporting metallic film 33, (ii) an insulating layer having parallel elongated leg parts 34 and 35, and (iii) terminal areas 36 and 37 disposed on each of the legs 34 and 35 respectively. The drawings shown at A and B of FIG. 4 represent the results employing etching techniques to form the insulating legs 34 and 35 where these legs are made of a conventionally etchable (as opposed to selectively etchable) insulating substance. Shown at C in FIG. 4 is the resultant structure obtained when the insulating legs 34 and 35 are made of a selectively etchable material such as that employed in our process.

Referring to FIG. 4A, it will be observed that the width $w$ of each of the legs of insulating material 34 and 35 is substantially greater than the thickness $\tau$ of the insulating layer. When subjected to an etching solution, the insulating material 34–35 is eroded with the same rapidity in both the vertical and horizontal directions, resulting in each of the legs 34 and 35 having a substantial slope after the etching operation has been completed. Since the width $w$ of the legs 34 and 35 is substantially greater than the thickness $\tau$ of the insulating layer, there remains sufficient area on the upper surface of each leg for deposition of metallic films 36 and 37 of sufficient width to facilitate the provision of electrical connections thereto.

In FIG. 4B, however, the width of each leg has been reduced to a value $w'$ on the same order as the thickness of the insulating layer 34–35. It is seen that in this case, the area available on the upper surface of each of the legs 34 and 35 for deposition of the respective terminal areas 36 and 37 is extremely small so that it is not possible to fabricate a useful assembly having such dimensions. It is therefore evident that a conventional etchable material is unsuitable for microminiature assemblies according to our invention, since the width which may be employed for the legs of the assembly is limited to a value substantially greater than the thickness of the glass layer 3.

In FIG. 4C, there is shown a structure manufactured by the use of a selectively etchable glass for the insulating legs 34 and 35. In a selectively etchable glass, portions of the glass which have been subjected to actinic radiation exhibit (after developing) a considerably different rate of disintegration in a suitable etching solution than those portions of the glass which have not been so irradiated. The result is that the irradiated portions of the glass layer are eroded very rapidly (after developing) while the non-irradiated portions are relatively unaffected, so that when the parts of the glass layer to be removed are irradiated through the entire thickness of the layer and subsequently subjected to the etching solution, the resultant legs 34 and 35 have steeply inclined slopes. This makes it possible to fabricate U-shaped structures in which the width of the legs is on the same order as the thickness of the insulating layer.

The preferred process for manufacturing the structure of FIG. 1A will now be described in detail. It should be understood, however, that various deviations from our preferred process will be evident to those skilled in the art. For example, in some instances the order of process steps may be changed and metals other than those set forth may be employed so long as the materials chosen possess the requisite qualities.

Our preferred process begins with cleaning both major surfaces of a Fotoform (a registered trademark) glass slide having an initial thickness of about 15 mils. Fotoform glass is a photosensitive, selectively etchable glass sold (under code number 8603) by Corning Glass Works, Corning, N.Y. The Fotoform glass is sensitive to ultraviolet radiation so that portions of the glass which have been exposed to such radiation dissolve (after developing) rapidly in a dilute hydrofluoric acid etching solution.

While we prefer to use Fotoform glass because of its good mechanical qualities and relatively high etch ratio, other photosensitive glasses are known in the art and may be employed in accordance with our invention. One such glass and the process for selectively etching the same is described in an article by S. D. Stookey entitled "Chemical Machining of Photosensitive Glass," published in Industrial and Engineering Chemistry, vol. 45, page 115, January 1953.

A suitable mask having a pattern of U-shaped opaque areas corresponding to the ultimately desired U-shaped configuration of the mounting assembly 1 is placed on one surface of the glass slide.

The glass slide is then exposed to ultraviolet radiation through the mask (3100 angstroms wavelength) so as to irradiate all but the protected U-shaped areas. A very large number of these U-shaped patterns can be formed on a single slide. For the dimensions shown in FIG. 1A, it is possible to form on the order of 1,000 patterns on a single 1 inch by 1 inch slide.

The exposed glass slide (on which the unexposed U-shaped patterns are readily visible) is now developed by heat treatment in order to substantially increase the solubility (in dilute hydrofluoric acid) of those portions of the glass which have been exposed to the actinic ultraviolet radiation.

The development of the glass is accomplished by transferring the exposed slide to a lightproof furnace (taking care to protect the glass from any ambient ultraviolet radiation during the transfer), and gradually raising the furnace temperature to a value on the order of 500° C. (somewhat below the softening range of the glass). After maintaining the furnace at this 500° C. temperature for about 30 minutes, the furnace temperature is gradually raised to about 580° C. (where the glass begins to soften) and held at the 580° C. temperature for about 90 minutes; at the end of this period the furnace is shut off and allowed to cool overnight, i.e. for a period on the order of 14 hours.

The aforementioned developing parameters are typical but may vary somewhat between different batches of the Fotoform glass.

The glass slide is removed from the cool furnace and cleaned by a light sand blast. The portions of the glass which have been exposed to the ultraviolet radiation are now readily etchable, while the non-irradiated parts of the glass are no longer photosensitive.

The slide is next ground and optically polished (on both major surfaces) to a final thickness of 5 mils. The optical polishing is necessary in the case of very small structures so that (i) the adjacent chromium layers to be subsequently deposited will adhere well to the glass, (ii) the chromium-glass interface will not be penetrable by subsequently employed etching solutions, and (iii) differential expansion (which would occur if only one surface were optically polished) will not cause warping of the glass.

The developed and polished glass slide is then immersed in Microstop (a proprietary protective lacquer sold by Michigan Chromium and Chemical Company, Detroit, Mich.) in order to cover both surfaces of the slide leaving only an edge region unprotected. The unprotected edge region is subjected to a hydrofluoric acid etch so that the etched edge will serve as a reference point for alignment of masks during subsequent process steps.

The Microstop is then removed in the same manner as that employed for removal of the Shipley AZ340 photoresist utilized in subsequent processing steps, i.e. by immersing the slide in acetone, and then subjecting any remaining Microstop (or photoresist) to the following solution:

20 grams of 37% (by weight) sodium hydroxide
20 grams trisodium phosphate, the aforementioned ingredients being added to enough water to provide 1 liter of solution; the solution is heated to a temperature on the order of 60° C. before application to the Microstop (or photoresist).

The glass slide is then thoroughly chemically cleaned by (i) immersion in trichloroethylene followed by (ii) ultrasonic agitation in water with a detergent (Sparkleen, manufactured by Calgon Corporation, Pittsburgh, Pa.) succeeded by (iii) immersion in Chromerge (a chromic-sulfuric acid solution manufactured by Manostat Corporation, New York, N.Y.), the Chromerge solution being maintained at a temperature of about 60° C.

The chemically cleaned glass slide is then placed in a vacuum evaporation chamber and heated to a temperature on the order of 350° C. Thin layers of chromium are evaporated onto the major surfaces of the glass slide while the slide is at or near the 350° C. temperature. The thickness of these chromium layers (corresponding to layers 21 and 29 in the drawing) is on the order of 200 angstroms. Chromium is employed because it adheres well to the glass, although it is apparent that other suitable adherent metals could also be employed. While the glass slide was heated to about 350° C. for the chromium evaporation, acceptable results were obtained with temperatures as low as 200° C. and as high as 400° C.

The next step involves evaporation of copper layers on each of the thin chromium layers. This is accomplished by (i) evaporating a short flash of copper onto each of the chromium surfaces while the slide is at an elevated temperature near 350° C., and (ii) following the flash with a relatively thick layer (on the order of 4 microns) of evaporated copper, the glass slide being allowed to cool while these relatively thick copper layers are being evaporated. By evaporating the copper while the glass is cooling, any stresses due to differential thermal expansion and contraction of the copper and glass layers in the resultant structure are minimized.

Now, a layer of Shipley AZ340 photoresist is applied to one of the copper surfaces of the glass slide, and photoetched to remove the resist only from portions of the copper layer overlying the legs of each of the previously exposed U-shaped areas of the glass. These exposed leg areas are electroplated with nickel to a thickness on the order of 1 micron.

A layer of substantially pure gold is electroplated on each nickel layer to a thickness on the order of 3 microns. For each of these electroplating steps, the relatively thick copper layer underlying each leg area serves to provide the requisite electrical connection. The nickel plating solution employed is the standard "Watts Nickel Bath." Other nickel plating solutions could also be employed, it being desirable only to avoid the use of organic additives in the plating solution. The gold plating solution employed was that known as the "Temperex" series manufactured by Sel-Rex Corporation, Nutley, N.J.

The Shipley photoresist is now removed in the same manner as the previous photoresist layer was taken off.

The structure of the partially completed mounting assemblies at this step in our process is shown in FIG. 5, which is an orthogonal drawing of a small area of the glass slide showing three adjacent partially completed mounting assemblies. The shaded areas of the drawing indicate those portions of the glass slide which have not been exposed to ultraviolet radiation. These unexposed portions define the U-shaped regions which will serve as the insulating layer 3 for each of the finished mounting assemblies 1.

A protective coating of Microstop is next applied to the lower surface of the slide (the surface which has not been plated with nickel and gold) and the slide is immersed in a standard ferric chloride copper etch solution (such as that sold by Hunts Company) to remove all portions of the exposed copper layer on the upper surface of the slide except those underlying the nickel/gold plated legs adjacent each U-shaped region. This is followed by immersion of the slide in the following chrome etch solution in order to remove the portions of the chromium layer underlying the areas from which the copper layer was removed:

95 parts of 37% (by weight) hydrochloric acid
5 parts water, the solution being heated to a temperature of 65–70° C.

After the aforementioned copper/chromium etching step, the Microstop is removed from the lower surface of the slide as before. The Microstop is then applied to the upper surface of the slide (the surface containing the plated "leg" areas) and the lower surface of the slide is electroplated with an additional copper layer to a thickness of about 1 mil. The Microstop is then removed from the upper surface of the slide.

A layer of Shipley AZ340 photoresist is next applied to the slide. The photoresist on the lower surface of the slide is photoetched to expose areas adjacent to each of the exposed U-shaped regions in the glass. These exposed areas are electroplated with additional copper to a total thickness of 3 mils. A 1 micron thick layer of nickel is next electroplated onto the 3 mil (total) thick copper areas, and a layer of substantially pure gold, 3–5 microns thick, is then electroplated onto the 1 micron nickel layer. The nickel and gold plating solutions are the same as those previously employed, while the copper plating solution is that designated "Udylite UBAC Bright Acid Copper Plating Process," manufactured by Udylite Corporation, Detroit, Mich.

At this step in the process, the structure represents that shown in cross section in FIG. 6, which indicates that each of the metallic terminal areas 27 and 28 on the legs of each U-shaped region is complete, as well as the supporting metallic layer (consisting of strata 21 to 24) underlying each of these U-shaped portions.

Now the slide is immersed in a solution of 20% (by weight) hydrofluoric acid to etch those parts of the glass which were initially exposed to ultraviolet radiation. Since the Fotoform glass has an etch ratio on the order of 20:1 (between exposed and unexposed regions of the glass), the walls of the resultant U-shaped glass portions which remain are substantially vertical. The hydrofluoric acid removes the glass between the legs of each U-shaped portion as well as the glass between adjacent U-shaped portions.

The slide is removed from the hydrofluoric acid etch and immersed in the aforementioned chromium etch solution to remove the chromium layer 21 from all portions of the lower surface of the slide except those uncovered by the U-shaped glass regions. It should be noted that during the aforementioned hydrofluoric acid etch and chromium etch process steps, the gold layers 24 and 32 protect the underlying regions of the partially completed mounting assemblies.

A layer of Shipley AZ340 photoresist is again applied to the upper surface of the slide (which is now maintained as a unitary assembly only by the copper layer 22*a*) and photoetched to expose only the areas between the legs of each of the U-shaped regions.

These exposed areas are now cleaned with Shipley No. 7 Copper Cleaner (manufactured by H. L. Shipley Company). Microstop is applied to the lower surface of the slide, and the exposed areas between the legs of the U-shaped regions are electroplated with a nickel layer 25 having a thickness of about 1 micron, and an overlying gold layer 26 having a thickness of about 3 microns. The nickel and gold plating solutions are the same as those previously employed. The photoresist is then removed from the upper surface of the slide.

The slide, at this point, is as shown in FIG. 7. The adjacent U-shaped structures are held together only by the copper layer 22*a*.

The final step involves immersion of the slide in the aforementioned ferric chloride copper etch solution to remove those portions of the layer 22*a* interconnecting the assemblies so that the assemblies separate into individual piece parts 1.

In each of the aforementioned process steps where the Shipley photoresist is applied to the slide, it is preferable, in order to insure good adhesion of the photoresist to the slide surface, to first treat the slide in the following manner:

(1) Immerse the slide in Shipley No. 7 Copper Cleaner to remove copper oxides and stains;

(2) Immerse the slide in ammonium persulfate to micro-etch the slide surface;

(3) Dip the slide in acetone;

(4) Dip the slide in iso-propyl alcohol; and (5) Bake the slide for 5 minutes at 60° C.

The resultant devices obtained by our preferred process resemble those shown in FIGS. 1A and 3. In order to obtain the beam lead structure of FIG. 1B, it is necessary only to deposit the metallic leg terminal areas 27 and 28 with a width somewhat greater than that of the underlying leg parts of the glass layer 3, so that the terminal areas 27 and 28 cantilever out from these glass leg parts.

It will be evident to those skilled in the art that while our preferred process begins with a slide of selectively etachable glass, it is possible to first form the supporting film 2, and to deposit the photosensitive glass layer 3 atop this supporting film. Also, it is possible to perform the various etching steps in a sequence other than that indicated. Rather than being formed by selective electroplating, the nickel and gold layers 31 and 32 as well as the copper, nickel, and gold layers 22*b*, 23 and 24 could each be deposited on the entire slide surface and photoetched to yield the desired geometries, or a selective electroless plating technique could be employed using the photoresist patterns as plating forms.

What is claimed is:

1. A process for manufacturing a plurality of electrical component mounting assemblies, comprising the steps of:

(a) forming a laminate including a first electrically-conductive metallic film and an adherent contiguous layer comprising a photosensitive glass sensitive to and permeable by incident actinic radiation such that said layer, when subsequently subjected to a given etchant, exhibits substantially different rates of disintegration between portions thereof which have been exposed to said radiation and other portions thereof which have not been exposed to said radiation;

(b) exposing portions of said glass to said radiation in accordance with a predetermined pattern, so that after subsequent exposure to said etchant there will remain only particular portions of said glass corresponding to said pattern;

(c) heat treating said glass layer with a given temperature-time profile to substantially increase the solubility in said etchant of the portions of said glass layer which have been exposed in step (b);

(d) selectively depositing an adherent electrically-conductive metallic film opposite said first metallic film on each of said particular portions of said glass layer;

(e) subjecting the exposed material of said layer to said etchant to remove a part of said glass layer leaving only said particular portions; and (f) removing selected portions of said first metallic film to separate said laminate into a plurality of pieces each including at least one said adherent metallic film and a portion of said first metallic film free of said glass.

2. A process according to claim 1, wherein each of said particular portions is U-shaped, said free portion of said first metallic film being disposed between the legs of the U.

3. A process according to claim 5, wherein said forming step (a) includes:

(i) chemically cleaning a surface of said selectively etchable glass layer;

(ii) heating the cleaned glass layer to a predetermined temperature sufficiently high to insure good adhesion of a particular metal to said surface;

(iii) subsequently evaporating a thin film of said particular metal onto the heated surface; and (iv) depositing an additional layer of a metal having relatively high electrical and thermal conductivity on said thin film.

4. A process according to claim 3, wherein said particular metal is chromium, and said thin film has a thickness on the order of 200 angstroms.

5. A process according to claim 4, wherein said predetermined temperature is on the order of 350° C.

6. A process according to claim 4, wherein said additional layer comprises copper.

7. A process according to claim 6, wherein said additional layer is deposited by evaporating an initial relatively thin layer of copper on said chromium film while maintaining said glass layer at an elevated temperature, and subsequently evaporating a relatively thick layer of copper on said initial layer while allowing said glass layer to cool from said elevated temperature.

8. A process according to claim 1, comprising the additional step of:

(f) selectively electroplating a supporting layer of a metal having good electrical and thermal conductivity onto the areas of said first metallic film adjacent said particular portions of said glass layer, said first metallic film serving to provide electrical connection to each of said areas.

9. A process for manufacturing a plurality of mounting assemblies each adapted to receive a semiconductor device, said device comprising a wafer of semiconductor material having upper and lower opposed major surfaces, said wafer having a plurality of active regions therein coupled to an associated respective plurality of electrodes, at least one of said electrodes being contiguous with said upper wafer surface, comprising the steps of:

(1) providing an insulating layer comprising a selectively etachable glass, said glass being sensitive to and permeable by actinic electromagnetic radiation such that, when subsequently subjected to a given etchant, portions of said layer which have been exposed to said radiation exhibit a substantially different rate of disintegration than other portions of said layer which have not been exposed to said radiation;

(2) selectively exposing said sensitive layer to said radiation in accordance with a predetermined pattern, so that after subsequent immersion in said etchant there will remain only particular portions of said layer corresponding to said pattern;

(3) heat treating the exposed glass layer with a given temperature-time profile so that the solubility in said etchant of the portions of said glass layer irradiated in step (2) is substantially increased;

(4) optically polishing both major surfaces of said glass layer;

(5) heating said glass layer to an elevated temperature sufficiently high to insure good adhesion of a particular metal to said glass;

(6) evaporating an adherent thin film of said particular metal onto each major surface of said glass layer while said glass layer is maintained at said elevated temperature;

(7) evaporating a relatively thick metallic film onto each of said thin films while allowing said glass layer to cool from said elevated temperature;

(8) depositing a supporting metallic layer on selected areas of one of said relatively thick films, each of said selected areas overlying a corresponding one of said particular portions of said glass layer;

(9) removing selected parts of the other of said relatively thick films so that there remains at least one portion of said other film on each of said particular portions of said glass layer;

(10) applying said etchant to remove areas of said glass layer so that only said particular portions remain, the surface area of each said particular portion being less than the corresponding supporting layer area so that a portion of the corresponding supporting layer is free of said glass, said particular portions and associated film portions being retained together as a unitary body substantially by said one relatively thick film; and

(11) removing sections of said one relatively thick film between adjacent ones of said particular portions, and separating said particular portions and the associated metallic layers and films into a plurality of piece parts, each of side piece parts including (i) one of said particular glass layer portions;

(ii) a selected area of said corresponding supporting layer adjacent one side of said particular portion, said suporting layer having a portion free of adjacent glass, and (iii) at least one portion of said other film adjacent the other side of said particular portion.

References Cited

UNITED STATES PATENTS

| | | | |
|---|---|---|---|
| 2,731,333 | 1/1956 | Ko et al. | 156—3 |
| 3,458,370 | 7/1969 | Cone | 156—11 |

JACOB H. STEINBERG, Primary Examiner

U.S. Cl. X.R.

29—626; 156—24

UNITED STATES PATENT OFFICE

CERTIFICATE OF CORRECTION

Patent No. 3,554,821 Dated January 12, 1971

Inventor(s) Martin Caulton/Stanley P. Knight/Ralph Di Stefano

It is certified that error appears in the above-identified patent and that said Letters Patent are hereby corrected as shown below:

Claim 3, Line 1 - Change "5" to -- 1 --.

Signed and sealed this 20th day of April 1971.

(SEAL)
Attest:

EDWARD M.FLETCHER,JR.
Attesting Officer

WILLIAM E. SCHUYLER,JR.
Commissioner of Patents